(12) United States Patent
Wu et al.

(10) Patent No.: US 11,761,078 B2
(45) Date of Patent: Sep. 19, 2023

(54) METHODS AND APPARATUS FOR PROCESSING A SUBSTRATE

(71) Applicant: Applied Materials, Inc., Santa Clara, CA (US)

(72) Inventors: Mengxue Wu, Singapore (SG); Siew Kit Hoi, Singapore (SG); Jay Min Soh, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 73 days.

(21) Appl. No.: 17/329,796

(22) Filed: May 25, 2021

(65) Prior Publication Data

US 2022/0380883 A1 Dec. 1, 2022

(51) Int. Cl.
*H01J 37/34* (2006.01)
*C23C 14/34* (2006.01)
*C23C 14/35* (2006.01)

(52) U.S. Cl.
CPC .......... *C23C 14/3407* (2013.01); *C23C 14/35* (2013.01); *H01J 37/3408* (2013.01); *H01J 37/3426* (2013.01); *H01J 37/3455* (2013.01)

(58) Field of Classification Search
None
See application file for complete search history.

(56) References Cited

U.S. PATENT DOCUMENTS

| 6,229,598 | B1 * | 5/2001 | Yoshida | G01S 17/10 356/5.03 |
| 8,070,925 | B2 | 12/2011 | Hoffman et al. | |
| 2005/0133365 | A1 * | 6/2005 | Hong | C23C 14/35 204/298.03 |
| 2006/0065525 | A1 * | 3/2006 | Weichart | C23C 14/35 204/298.26 |
| 2010/0006424 | A1 | 1/2010 | Chung et al. | |

FOREIGN PATENT DOCUMENTS

| CN | 111146117 A | | 5/2020 |
| JP | 2020169352 A | * | 10/2020 |
| JP | 2020169352 A | | 10/2020 |
| KR | 20010001581 A | | 1/2001 |
| WO | WO 2005/007924 A1 | | 1/2005 |

OTHER PUBLICATIONS

International Search Report for PCT/US2022/028269, dated Aug. 30, 2022.

* cited by examiner

*Primary Examiner* — Jason Berman
(74) *Attorney, Agent, or Firm* — MOSER TABOADA

(57) ABSTRACT

Methods and apparatus for processing substrates are provided herein. For example, a magnet to target spacing system configured for use with an apparatus for processing a substrate comprises a sensor configured to provide a signal corresponding to a distance between a front of a magnet and a back of a target while rotating the magnet with respect to the target and a magnet controller configured to control the distance between the front of the magnet and the back of the target based upon the signal provided by the sensor.

11 Claims, 3 Drawing Sheets

METHODS AND APPARATUS FOR PROCESSING A SUBSTRATE

FIELD

Embodiments of the disclosure generally relate to methods and apparatus for processing substrates. More particularly, embodiments of the disclosure relate to auto increase or decrease magnet to target (M-T) spacing with sensor feedback system.

BACKGROUND

Conventional plasma processing (physical vapor deposition) chambers use one or more magnets to facilitate directing sputter material plasma toward a substrate. For example, magnetron assemblies can be positioned above a target disposed within a processing volume of the processing chamber. The magnetron can comprise a plurality of magnets that are configured to produce a magnetic field within the processing chamber near a front face of the target to generate plasma so a significant flux of ions strike the target, causing sputter emission of target material toward a substrate.

The plurality of magnets may be spaced from a back surface of a backing plate to which the target is attached. Spacing between the plurality of magnets and the target is a crucial parameter that can greatly affect the specifications of a film deposited on a substrate. For example, the spacing between the plurality of magnets and the target can affect a deposition rate of a film, deposition profile of the film (e.g., inconsistent thickness across a substrate), can cause target bow, which can result in inconsistent spacing, increased DC voltage at a radius of the target, and can worsen over a life of the target, backing plate scratching, etc.

SUMMARY

Methods and apparatus for processing a substrate are provided herein. In some embodiments, For example, a magnet to target spacing system configured for use with an apparatus for processing a substrate includes a sensor configured to provide a signal corresponding to a distance between a front of a magnet and a back of a target while rotating the magnet with respect to the target and a magnet controller configured to control the distance between the front of the magnet and the back of the target based upon the signal provided by the sensor.

In accordance with at least some embodiments, a processing chamber for processing a substrate includes a substrate support disposed within a processing volume of the processing chamber and configured to support a substrate, a target configured to sputter material toward the substrate support, a magnetron comprising a magnet rotatable along a pathway during operation, a sensor configured to provide a signal corresponding to a distance between a front of a magnet and a back of a target while rotating the magnet with respect to the target, and a magnet controller configured to control the distance between the front of the magnet and the back of the target based upon the signal provided by the sensor.

In accordance with at least some embodiments, a method for processing a substrate includes detecting a distance between a front of a magnet and a back of a target while rotating the magnet with respect to the target and controlling the distance between the front of the magnet and the back of the target to a desired value based upon a detected distance.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
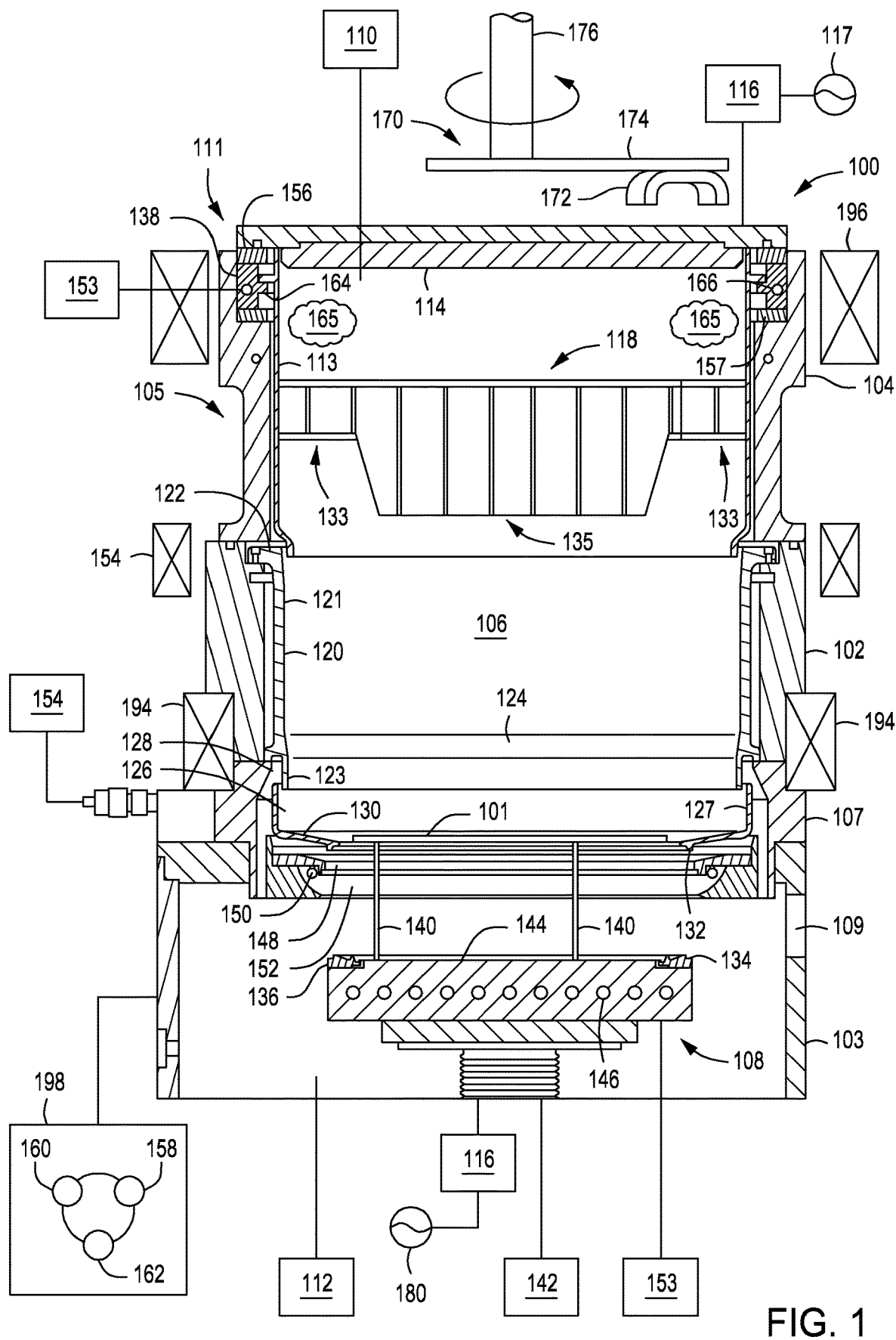
FIG. 1 is a schematic cross-sectional view of a processing chamber, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for processing a substrate are provided herein. For example, the methods and apparatus described herein provide improved ways to maintain an optimal spacing between one or more magnets of a magnetron and a target throughout a life of the target. For example, a magnet to target spacing system comprises a sensor configured to provide a signal corresponding to a distance between a front of a magnet and a back of a target while rotating the magnet with respect to the target. The magnet to target spacing system also comprises a magnet controller configured to control a distance between the front of the magnet and the back of the target based upon the signal provided by the sensor. The methods and apparatus described herein provide a direct and simple solution to maintain proper spacing between the one or more magnets and the target, which, in turn, can minimize, if not eliminate, the effect of target bow. Movement of the one or more magnets can be automatic and does not require external intervention. Additionally, the methods and apparatus describe herein provide an auto adjustment of M-T spacing, are adaptable into different processing chambers that need stable M-T spacing to maintain good film properties, are capable of operating/controlling processing chamber with target bow and maintain the film properties, are capable of resolving coverage issues related to M-T spacing, provide low manufacturing cost, as only a laser sensor is added to existing hardware, and are not limited to material of the target.

FIG. 1 depicts a schematic side view of a processing chamber 100 (e.g., a plasma processing chamber), in accordance with at least some embodiments of the present disclosure. In some embodiments, the processing chamber 100 is a PVD processing chamber suitable for sputter depositing materials on a substrate having a given diameter. Illustrative examples of suitable PVD chambers that may be adapted to benefit from the present disclosure include those commercially available from Applied Materials, Inc., of Santa Clara, California. Other processing chambers available from Applied Materials, Inc. as well as other manufacturers may also be adapted in accordance with the embodiments described herein.

The processing chamber 100 generally includes an upper sidewall 102, a lower sidewall 103, a ground adapter 104, and a lid assembly 111 defining a body 105 that encloses an interior volume 106. An adapter plate 107 may be disposed between the upper sidewall 102 and the lower sidewall 103.

A substrate support 108 is disposed in the interior volume 106 of the processing chamber 100. The substrate support 108 is configured to support a substrate having a given diameter (e.g., 150 mm, 200 mm, 300 mm, 450 mm, or the like). A substrate transfer port 109 is formed in the lower sidewall 103 for transferring substrates into and out of the interior volume 106.

A gas source 110 is coupled to the processing chamber 100 to supply process gases into the interior volume 106. Process gases may include inert gases, non-reactive gases, and reactive gases, if necessary. Examples of process gases that may be provided by the gas source 110 include, but are not limited to, argon gas (Ar), helium (He), neon gas (Ne), nitrogen gas ($N_2$), oxygen gas ($O_2$), and water ($H_2O$) vapor, other noble gases, among others.

A pumping device 112 is coupled to the processing chamber 100 in communication with the interior volume 106 to control the pressure of the interior volume 106. In at least some embodiments, during deposition the pressure level of the processing chamber 100 may be maintained from about 1 mTorr to about 1 Torr, e.g., from about 300 mTorr to about 500 mTorr.

The ground adapter 104 may support a target, such as the target 114. The target 114 is fabricated from a material to be deposited on the substrate. In at least some embodiments, the target 114 may be fabricated from aluminum (Al), cobalt (Co), copper (Cu), nickel (Ni), tantalum (Ta), titanium (Ti), tungsten (W), alloys thereof, combinations thereof, or the like. In at least some embodiments, the processing chamber 100 is configured to deposit, for example, aluminum oxide ($AlO_2$), aluminum oxynitride (such as ALON), Co, Cu, Ta, tantalum nitride (TaN), tantalum oxynitride (TaOxNy), Ti, titanium oxynitride (TiOxNy), W, or tungsten nitride (WN) on a substrate.

The target 114 may be coupled to a source assembly comprising a power supply 117 for the target 114. For example, the power supply 117 may be an RF power supply, which may be coupled to the target 114 via a matching network 116. In some embodiments, the power supply 117 may alternatively be a DC power supply, in which case the matching network 116 is omitted. In some embodiments, the power supply 117 may include both DC and RF power sources. Additionally, in some embodiments, the target 114 may include a backing plate (not shown in FIG. 1), which can be provided to improve structural stability of the target 114. The backing plate may comprise a conductive material, such as copper-zinc, copper-chrome, or the same material as the target 114, such that RF, and optionally DC, power can be coupled to the target 114 via the backing plate. Alternatively, the backing plate may be non-conductive and may include conductive elements (not shown) such as electrical feedthroughs or the like.

A magnetron 170 is positioned above the target 114 and may include one or more magnets 172, which are rotatable along a pathway, supported by a base plate 174 connected to a shaft 176, which may be axially aligned with the central axis of the processing chamber 100 and the substrate 101. The one or more magnets 172 produce a magnetic field within the processing chamber 100 near the front face of the target 114 to generate plasma 165 so a significant flux of ions strike the target 114, causing sputter emission of target material. The one or more magnets 172 may be rotated about the shaft 176 to increase uniformity of the magnetic field across the surface of the target 114. In general, the one or more magnets 172 may be rotated such that the innermost magnet position during rotation of the one or more magnets 172 is disposed above or outside of the diameter of the substrate being processed (e.g., the distance from the axis of rotation to the innermost position of the one or more magnets 172 is equal to or greater than the diameter of the substrate being processed).

A collimator 118 can be positioned in the interior volume 106 between the target 114 and the substrate support 108. A central region 135 of the collimator 118 generally corresponds to the diameter of the substrate being processed (e.g., is equal to or substantially equal to the diameter of the substrate). Thus, a peripheral region 133 of the collimator 118 generally corresponds to an annular region radially outward of the substrate being processed (e.g., the inner diameter of the peripheral region 133 is substantially equal to or greater than the diameter of the substrate). In some embodiments, the collimator 118 may be electrically biased to control ion flux to the substrate and neutral angular distribution at the substrate, as well as to increase the deposition rate due to the added DC bias.

The collimator 118 is coupled to an upper shield 113, which in turn is coupled to the process tool adapter 138. The process tool adapter 138 may be made from suitable conductive materials compatible with processing conditions in the processing chamber 100. An insulator ring 156 and an insulator ring 157 are disposed on either side of the process tool adapter 138 to electrically isolate the process tool adapter 138 from the ground adapter 104. The insulator rings 156, 157 may be made from suitable process compatible dielectric materials.

In at least some embodiments, a first set of magnets 196 may be disposed adjacent to the ground adapter 104 to assist with generating the magnetic field to guide dislodged ions from the target 114 through the peripheral region 133. In at least some embodiments, a second set of magnets 194 may be disposed in a position to form a magnetic field between the bottom of the collimator 118 and the substrate to guide the metallic ions dislodged from the target 114 and distribute the ions more uniformly over the substrate 101. In at least some embodiments, a third set of magnets 154 may be disposed between the first and second set of magnets 196, 194 and about centered with or below a substrate-facing surface of the central region 135 of the collimator 118 to further guide the metallic ions towards the center of the substrate 101.

The process tool adapter 138 includes one or more features to facilitate supporting a process tool within the interior volume 106, such as the collimator 118. For example, as shown in FIG. 1, the process tool adapter 138 includes a mounting ring, or shelf 164 that extends in a radially inward direction to support the upper shield 113.

In some embodiments, a coolant channel 166 may be provided in the process tool adapter 138 to facilitate flowing a coolant through the process tool adapter 138 to remove heat generated during processing. For example, the coolant channel 166 may be coupled to a cooling apparatus 153 (coolant source) to provide a suitable coolant, such as water (deionized water), nitrogen, argon, or other noble gas, clean dry air (CDA), or corrosive gas, etc. The coolant channel 166 advantageously removes heat from the process tool (e.g., collimator 118) that is not readily transferred to other cooled chamber components, such as the ground adapter 104.

A radially inwardly extending ledge (e.g., the mounting ring, or shelf 164) is provided to support the upper shield 113 within the central opening within the interior volume 106 of the processing chamber 100. The shelf 164 can be disposed in a location proximate the coolant channel 166 to facilitate maximizing the heat transfer from the collimator 118 to the coolant flowing in the coolant channel 166 during use.

A lower shield 120 may be provided in proximity to the collimator 118 and interior of the ground adapter 104 or the upper sidewall 102. The lower shield 120 may include a tubular body 121 having a radially outwardly extending flange 122 disposed in an upper surface of the tubular body 121. The flange 122 provides a mating interface with an upper surface of the upper sidewall 102. The tubular body 121 of the lower shield 120 may include a shoulder region 123 having an inner diameter that is less than the inner diameter of the remainder of the tubular body 121. The inner surface of the tubular body 121 transitions radially inward along a tapered surface 124 to an inner surface of the shoulder region 123.

A shield ring 126 may be disposed in the processing chamber 100 adjacent to the lower shield 120 and intermediate of the lower shield 120 and the adapter plate 107. The shield ring 126 may be at least partially disposed in a recess 128 formed by an opposing side of the shoulder region 123 of the lower shield 120 and an interior sidewall of the adapter plate 107. The shield ring 126 may include an axially projecting annular sidewall 127 that has an inner diameter that is greater than an outer diameter of the shoulder region 123 of the lower shield 120.

A radial flange 130 extends from the annular sidewall 127. The radial flange 130 includes a protrusion 132 formed on a lower surface of the radial flange 130. The protrusion 132 may be a circular ridge extending from the surface of the radial flange 130 in an orientation that is substantially parallel to the inside diameter surface of the annular sidewall 127 of the shield ring 126. The protrusion 132 is generally adapted to mate with a recess 134 formed in an edge ring 136 disposed on the substrate support 108. The recess 134 may be a circular groove formed in the edge ring 136. The engagement of the protrusion 132 and the recess 134 centers the shield ring 126 with respect to the longitudinal axis of the substrate support 108. The substrate 101 (shown supported on lift pins 140) is centered relative to the longitudinal axis of the substrate support 108 by coordinated positioning calibration between the substrate support 108 and a robot blade (not shown).

An RF power source 180 may be coupled to the processing chamber 100 through the substrate support 108 to provide a bias power between the target 114 and the substrate support 108. In some embodiments, a match network (e.g., the matching network 116) can be coupled between the RF power source 180 and the substrate support 108. The RF power source 180 may have a frequency between about 400 Hz and about 60 MHz, such as about 13.56 MHz.

In operation, a robot blade (not shown) having the substrate 101 disposed thereon is extended through the substrate transfer port 109. The substrate support 108 may be lowered to allow the substrate 101 to be transferred to the lift pins 140 extending from the substrate support 108. Lifting and lowering of the substrate support 108 and/or the lift pins 140 may be controlled by a drive 142 coupled to the substrate support 108. The substrate 101 may be lowered onto a substrate receiving surface 144 of the substrate support 108. With the substrate 101 positioned on the substrate receiving surface 144 of the substrate support 108, sputter deposition may be performed on the substrate 101. The edge ring 136 may be electrically insulated from the substrate 101 during processing.

After sputter deposition, the substrate 101 may be elevated utilizing the lift pins 140 to a position that is spaced away from the substrate support 108. The elevated location may be proximate one or both of the shield ring 126 and a reflector ring 148 adjacent to the adapter plate 107. The adapter plate 107 includes one or more lamps 150 coupled to the adapter plate 107 at a position intermediate of a lower surface of the reflector ring 148 and a concave surface 152 of the adapter plate 107. The lamps 150 provide optical and/or radiant energy in the visible or near visible wavelengths, such as in the infra-red (IR) and/or ultraviolet (UV) spectrum. The energy from the lamps 150 is focused radially inward toward the backside (i.e., lower surface) of the substrate 101 to heat the substrate 101 and the material deposited thereon.

After controlling the substrate 101 to a predetermined temperature, the substrate 101 is lowered to a position on the substrate receiving surface 144 of the substrate support 108. The substrate 101 may be rapidly cooled utilizing thermal control channels 146 in the substrate support 108 via conduction. For example, the cooling apparatus 153 can be connected to the substrate support 108 and be configured to provide one or more coolants to the substrate support 108. The substrate 101 may be removed from the processing chamber 100 through the substrate transfer port 109 for further processing.

A controller 198 is coupled to the processing chamber 100. The controller 198 includes a central processing unit 160, a memory 158, and support circuits 162. The controller 198 is utilized to control the process sequence, regulating the gas flows from the gas source 110 into the processing chamber 100 and controlling ion bombardment of the target 114. The central processing unit 160 may be of any form of a general-purpose computer processor that can be used in an industrial setting. The software routines (e.g., instructions) can be stored in the memory 158 (e.g., non-transitory computer readable storage medium), such as random-access memory, read only memory, floppy or hard disk drive, or other form of digital storage. The support circuits 162 are conventionally coupled to the central processing unit 160 and may comprise cache, clock circuits, input/output subsystems, power supplies, and the like. The software routines, when executed by the central processing unit 160, transform the central processing unit into a specific purpose computer that controls the processing chamber 100 such that the processes, including the substrate support 108 cooling processes disclosed below, are performed in accordance with embodiments of the present disclosure. The software routines may also be stored and/or executed by a second controller (not shown) that is located remotely from the processing chamber 100.

During processing, material is sputtered from the target 114 and deposited on the surface of the substrate 101. The target 114 and the substrate support 108 are biased relative to each other by the power supply 117 or the RF power source 180 to maintain a plasma formed from the process gases supplied by the gas source 110. The DC pulsed bias power applied to the collimator 118 also assists controlling ratio of the ions and neutrals passing through the collimator 118, advantageously enhancing the trench sidewall and bottom fill-up capability. The ions from the plasma are accelerated toward and strike the target 114, causing target material to be dislodged from the target 114. The dislodged target material and process gases forms a layer on the substrate 101 with desired compositions.

Figure 2:
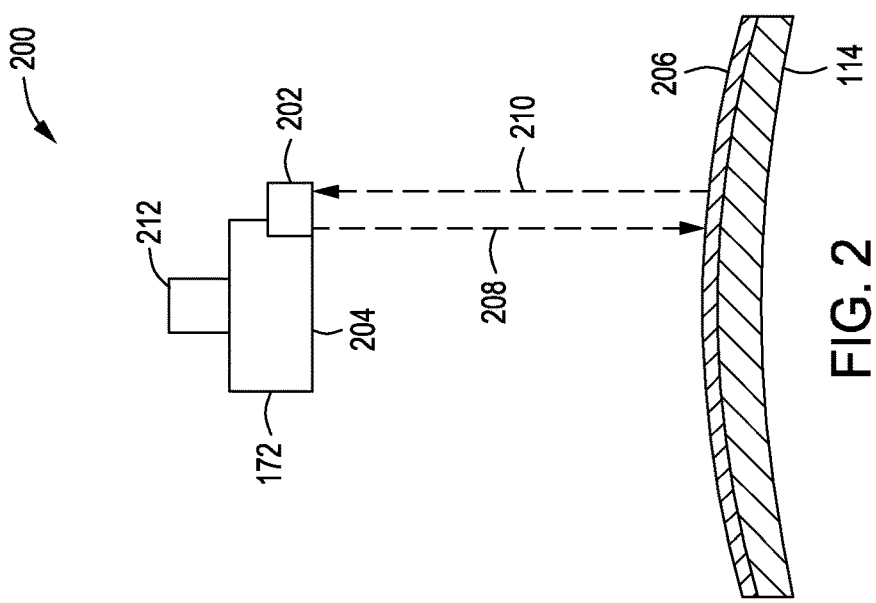
FIG. 2 is a diagram of a magnet to target spacing system configured for use with the processing chamber of FIG. 1, in accordance with at least some embodiments of the present disclosure.

FIG. 2 is a diagram of a magnet to target spacing system 200 configured for use with the processing chamber 100 of FIG. 1, in accordance with at least some embodiments of the present disclosure. For example, the magnet to target spacing system 200 comprises a sensor 202 that is configured to provide a signal corresponding to a distance between a front 204 of a magnet (e.g., the one or more magnets 172) and a back 206 of a target (e.g., the target 114) while rotating the magnet with respect to the target. The sensor 202 can be any sensor that is capable of transmitting and receiving a beam. For example, in at least some embodiments, the sensor 202 is a laser sensor that is configured for transmitting a detection beam 208 toward the back 206 of the target and a receive a reflection beam 210 from the back 206 of the target. The sensor 202 can be coupled to one or more areas of the magnet via one or more suitable coupling apparatus. For example, in the illustrated embodiment, the sensor 202 is coupled to a side surface of the magnet via one or more screws, nuts, bolts, etc.

The target spacing system 200 also comprises a magnet controller 212 (e.g., the controller 198), which is communicatively coupled (wired or wireless) to the sensor 202, configured to control a distance between the front 204 of the magnet and the back 206 of the target based upon the signal provided by the sensor 202. For example, the magnet controller 212 is configured to determine a change in a distance between the front 204 of the magnet and the back 206 of the target based on a travel speed of the detection beam 208, a change in time from when the detection beam 208 is transmitted to when the reflection beam 210 is received, and a fixed scalar value (e.g., a fixed scalar value of 0.5). For example, the change in the distance between the front 204 of the magnet and the back 206 of the target can be calculated using the Equation:

$$\text{change in the distance} = 0.5 * \Delta t * V_{BEAM} \ldots, \quad (1)$$

where $V_{BEAM}$=travel speed of a detection beam 208, $\Delta t$=a change in time from when the detection beam 208 is transmitted to when the reflection beam 210 is received, and 0.5 is the fixed scalar value. In at least some embodiments, during operation, a change in the distance between the front 24 of the magnet and the back 206 of the target can be about 2.75 mm to about 3.25 mm.

Figure 3:
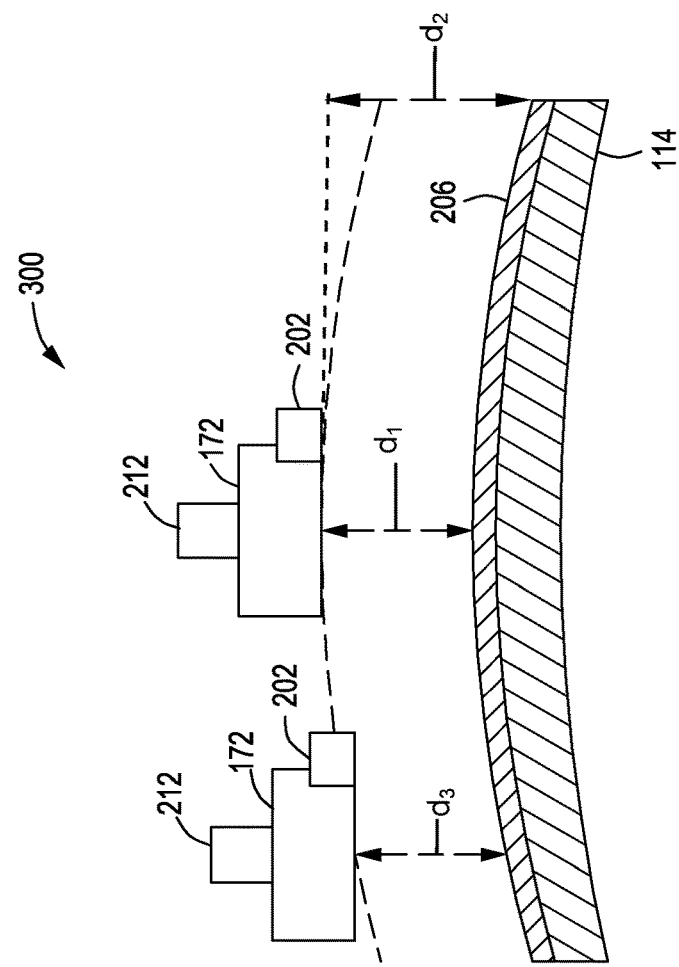
FIG. 3 is a diagram of a magnet to target spacing system configured for use with the processing chamber of FIG. 1, in accordance with at least some embodiments of the present disclosure.

FIG. 3 is a diagram of a magnet to target spacing system 300 configured for use with the processing chamber 100 of FIG. 1, in accordance with at least some embodiments of the present disclosure. The target spacing system 300 of FIG. 3 is substantially similar to the target spacing system 200 of FIG. 2. Accordingly, only those features that are unique to the target spacing system 300 are described herein. For example, as noted above, the magnetron 170 can include one or more magnets 172 that can be coupled to the base plate 174. Thus, the target spacing system 300 comprises two or more magnets 172 (two shown in FIG. 3) comprising the sensor 202 and the magnet controller 212. In the embodiment in FIG. 3, one of the two magnets is disposed adjacent (above) a center of the target 114 and the other of the two magnets can be disposed adjacent (above) a peripheral edge of the target 114, which is, typically, where target bow occurs more frequently.

Figure 4:
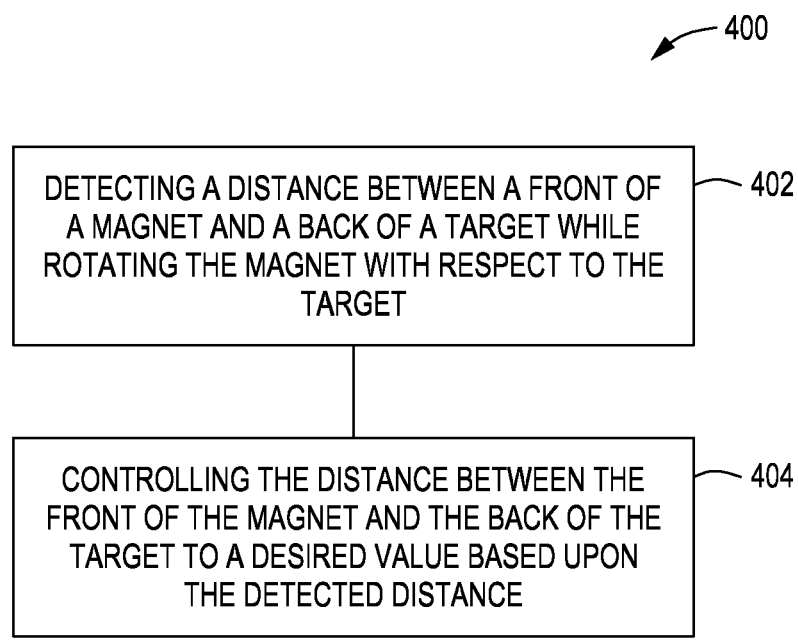
FIG. 4 is a flowchart of a method for processing a substrate, in accordance with at least some embodiments of the present disclosure.

FIG. 4 is a flowchart of a method 400 for processing a substrate, in accordance with at least some embodiments of the present disclosure. For example, during PVD the magnetron 170 can rotate the one or more magnets 172, via the shaft 176, to produce a magnetic field within the processing chamber 100 near the front face of the target 114 to generate plasma so a significant flux of ions strike the target 114, causing sputter emission of target material.

At 402, the method 400 comprises detecting a distance between a front of a magnet and a back of a target while rotating the magnet with respect to the target. For example, at 402, the magnet controller 212 can detect a distance between the front 204 of the one or more magnets 172 and the back 206 of the target 114 while rotating the one or more magnets 172. For example, the sensor 202 can transmit the detection beam 208 toward the back 206 of the target 114. Next, the magnet controller 212 can receive the reflection beam from the back 206 of the target 114. The magnet controller 212 can detect if a spacing between the front 204 of the one or more magnets 172 and the back 206 of the target has changed. For example, a change in a distance between the front 204 of the one or more magnets 172 and the back 206 of the target 114 is based on a travel speed of the detection beam 208, a change in time from when the detection beam 208 is transmitted to when the reflection beam 210 is received, and a fixed scalar value (e.g., the fixed scalar value can be 0.5). As noted above, in at least some embodiments, the distance between the front 204 of the magnet and the back 206 of the target 114 can be calculated using Equation (1).

Next, at 404, the method 400 comprises controlling the distance between the front 204 of the one or more magnets 172 and the back 206 of the target 1147 to a desired value based upon the detected distance. For example, when the magnet controller 212 determines that the distance between the front 204 of the one or more magnets 172 and the back 206 of the target 114 has changed, the magnet controller 212 controller can transmit a command signal to a magnet drive assembly (not shown) connected to the shaft 176 of the magnetron to move the shaft 176 upwards or downwards (e.g., to move the front 204 of the one or more magnets away from or closer to the back 206 of the target 114). For example, as illustrated in FIG. 3, as a distance between the front 204 of the one or more magnets 172 and the back 206 of the target 114 has increased, e.g., due to target bow ($d_1$ less than $d_2$), the magnet controller 212 controller can transmit a command signal to the magnet drive assembly to move the shaft 176 downwards, e.g., closer to the back 206 of the target 114, to maintain a consistent distance between the front 204 of the one or more magnets 172 and the back 206 of the target 114, e.g., $d_3 = d_1$).

While the foregoing is directed to embodiments of the present disclosure, other and further embodiments of the disclosure may be devised without departing from the basic scope thereof.

The invention claimed is:

1. A magnet to target spacing system configured for use with an apparatus for processing a substrate, comprising:
   a sensor configured to provide a signal corresponding to a distance between a front of a magnet and a back of a target while rotating the magnet with respect to the target, wherein the sensor is a laser sensor configured to transmit a detection beam toward the back of the target and a receive a reflection beam from the back of the target; and a magnet controller configured to control the distance between the front of the magnet and the back of the target based upon the signal provided by the sensor, wherein the magnet controller is further configured to control the distance between the front of the magnet and the back of the target based on a travel speed of the detection beam, a change in time from when the detection beam is transmitted to when the reflection beam is received, and a fixed scalar value, and wherein the fixed scalar value is 0.5.

2. The magnet to target spacing system of claim 1, wherein the magnet controller is further configured to control the distance between the front of the magnet and the back of the target using Equation:

change in a distance=0.5*Δ*t*\*VBEAM, where VBEAM=travel speed of the detection beam and Δt=a change in time from when the detection beam is transmitted to when the reflection beam is received.

3. The magnet to target spacing system of claim 1, wherein the target is made from copper.

4. The magnet to target spacing system of claim 1, wherein the magnet controller is further configured to control the distance between the front of the magnet and the back of the target such that a change in the distance between the front of the magnet and the back of the target is about 2.75 mm to about 3.25 mm.

5. A processing chamber for processing a substrate, comprising:

a substrate support disposed within a processing volume of the processing chamber and configured to support a substrate;

a target configured to sputter material toward the substrate support;

a magnetron comprising a magnet rotatable along a pathway during operation;

a sensor configured to provide a signal corresponding to a distance between a front of the magnet and a back of the target while rotating the magnet with respect to the target, wherein the sensor is a laser sensor configured to transmit a detection beam toward the back of the target and a receive a reflection beam from the back of the target; and a magnet controller configured to control the distance between the front of the magnet and the back of the target based upon the signal provided by the sensor, wherein the magnet controller is further configured to control the distance between the front of the magnet and the back of the target based on a travel speed of the detection beam, a change in time from when the detection beam is transmitted to when the reflection beam is received, and a fixed scalar value, and wherein the fixed scalar value is 0.5.

6. The processing chamber of claim 5, wherein the magnet controller is further configured to control the distance between the front of the magnet and the back of the target using Equation:

change in the distance=0.5*Δ*t* VBEAM, where VBEAM=travel speed of the detection beam and Δt=a change in time from when the detection beam is transmitted to when the reflection beam is received.

7. The processing chamber of claim 5, wherein the target is made from copper.

8. The processing chamber of claim 5, wherein the magnet controller is further configured to control the distance between the front of the magnet and the back of the target such that a change in the distance between the front of the magnet and the back of the target is about 2.75 mm to about 3.25 mm.

9. A method for processing a substrate, comprising:

detecting a distance between a front of a magnet and a back of a target while rotating the magnet with respect to the target, wherein detecting the distance between the front of the magnet and the back of the target comprises transmitting a detection beam toward the back of the target and receiving a reflection beam from the back of the target; and controlling the distance between the front of the magnet and the back of the target to a desired value based upon a detected distance, wherein controlling the distance between the front of the magnet and the back of the target is based on a travel speed of a detection beam, a change in time from when the detection beam is transmitted to when the reflection beam is received, and a fixed scalar value, and wherein the fixed scalar value is 0.5.

10. The method of claim 9, wherein controlling the distance between the front of the magnet and the back of the target is determined using Equation:

change in the distance=0.5*Δ*t* VBEAM, where VBEAM=travel speed of the detection beam and Δt=a change in time from when the detection beam is transmitted to when the reflection beam is received.

11. The method of claim 9, wherein the target is made from copper.

\* \* \* \* \*